United States Patent
Lee et al.

(10) Patent No.: US 10,483,150 B2
(45) Date of Patent: Nov. 19, 2019

(54) APPARATUS FOR STACKING SEMICONDUCTOR CHIPS IN A SEMICONDUCTOR PACKAGE

(71) Applicant: SAMSUNG ELECTRONICS CO., LTD., Suwon-si, Gyeonggi-Do (KR)

(72) Inventors: Gun-Ah Lee, Hwaseong-si (KR); Ji-Hwan Hwang, Hwaseong-si (KR); Cha-Jea Jo, Yongin-si (KR); Dong-Han Kim, Osan-si (KR); Seung-Kon Mok, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 222 days.

(21) Appl. No.: 15/349,327

(22) Filed: Nov. 11, 2016

(65) Prior Publication Data
US 2017/0236798 A1    Aug. 17, 2017

(30) Foreign Application Priority Data
Feb. 11, 2016    (KR) .................. 10-2016-0015682

(51) Int. Cl.
H01L 21/683    (2006.01)
H01L 21/67    (2006.01)
(Continued)

(52) U.S. Cl.
CPC .... H01L 21/6838 (2013.01); H01L 21/67144 (2013.01); H01L 24/75 (2013.01); *H01L 24/14* (2013.01); *H01L 24/16* (2013.01); *H01L 24/32* (2013.01); *H01L 24/81* (2013.01); *H01L 24/83* (2013.01); *H01L 25/0657* (2013.01); *H01L 25/18* (2013.01); *H01L 25/50* (2013.01); *H01L 2224/0401* (2013.01); *H01L 2224/0557* (2013.01); *H01L 2224/06181* (2013.01); *H01L 2224/14181* (2013.01); *H01L 2224/16145* (2013.01); *H01L 2224/16225* (2013.01); *H01L 2224/32145* (2013.01);
(Continued)

(58) Field of Classification Search
CPC .............. B29C 66/814; B29C 66/8141; B29C 66/81421; B29C 66/81422; B29C 66/81423; B29C 66/81425; H01L 21/67144; H01L 21/6838; H01L 24/74
USPC ................................................. 156/580, 581
See application file for complete search history.

(56) References Cited

U.S. PATENT DOCUMENTS 6,491,785 B1 * 12/2002 Sato ...................... B23K 20/10
                                                                                156/358
6,774,011 B2    8/2004 Nakazawa et al.
(Continued)

FOREIGN PATENT DOCUMENTS

KR    10-0436188    7/2004
KR    10-0638760    10/2006

*Primary Examiner* — George R Koch
(74) *Attorney, Agent, or Firm* — F. Chau & Associates, LLC (57) ABSTRACT

An apparatus for stacking semiconductor chips includes a push member configured to apply pressure to a semiconductor chip disposed on a substrate. The push member includes a push plate configured to contact the semiconductor chip, and a push rod connected to the push plate. The push plate includes a central portion having an area smaller than an area of an upper side of the semiconductor chip, and a plurality of protrusions disposed at respective ends of the central portion.

19 Claims, 7 Drawing Sheets

(51) Int. Cl.
  *H01L 23/00*   (2006.01)
  *H01L 25/065*  (2006.01)
  *H01L 25/18*   (2006.01)
  *H01L 25/00*   (2006.01)

(52) U.S. Cl.
  CPC .............. *H01L 2224/32225* (2013.01); *H01L 2224/73204* (2013.01); *H01L 2224/7592* (2013.01); *H01L 2224/75702* (2013.01); *H01L 2224/75901* (2013.01); *H01L 2224/81005* (2013.01); *H01L 2224/83005* (2013.01); *H01L 2225/06513* (2013.01); *H01L 2924/07802* (2013.01); *H01L 2924/1434* (2013.01); *H01L 2924/15174* (2013.01); *H01L 2924/37001* (2013.01)

(56) References Cited

U.S. PATENT DOCUMENTS

| | | |
|---|---|---|
| 7,265,035 B2 | 9/2007 | Honma et al. |
| 7,650,688 B2 | 1/2010 | Lee et al. |
| 8,092,645 B2 | 1/2012 | Yip et al. |
| 8,146,032 B2 | 3/2012 | Chen et al. |
| 8,832,608 B1 | 9/2014 | Chakrabarty et al. |
| 8,852,391 B2 | 10/2014 | McCutcheon et al. |
| 9,140,978 B2 | 9/2015 | Ken |
| 9,142,441 B2 | 9/2015 | Yamamoto et al. |
| 2008/0128081 A1* | 6/2008 | Wang ................ H01L 21/6838 156/285 |
| 2014/0295656 A1 | 10/2014 | Waterworth et al. |
| 2015/0171067 A1 | 6/2015 | Raorane et al. |

* cited by examiner

APPARATUS FOR STACKING SEMICONDUCTOR CHIPS IN A SEMICONDUCTOR PACKAGE

CROSS-REFERENCE TO RELATED APPLICATION

This application claims priority under 35 U.S.C. § 119 to Korean Patent Application No. 10-2016-0015682, filed on Feb. 11, 2016, in the Korean Intellectual Property Office, the disclosure of which is incorporated by reference herein in its entirety.

Technical Field

The inventive concept relates to equipment for manufacturing a semiconductor package, and more particularly, to an apparatus for stacking semiconductor chips in a semiconductor package.

Discussion of the Related Art

Generally, semiconductor chips may be formed by performing various semiconductor processes on a wafer. A semiconductor package may be formed by mounting the semiconductor chips on a substrate. As the sizes of semiconductor chips are becoming smaller, the semiconductor packages also are becoming smaller. However, mounting small semiconductor chips on a small semiconductor package may be difficult.

SUMMARY

The inventive concept provides an apparatus for stacking semiconductor chips, whereby a bonding process for joining a substrate and semiconductor chips or stacked semiconductor chips is efficiently performed in a process of manufacturing a semiconductor package.

According to an exemplary embodiment of the inventive concept, an apparatus for stacking semiconductor chips includes a push member configured to apply pressure to a semiconductor chip disposed on a substrate. The push member includes a push plate configured to contact the semiconductor chip, and a push rod connected to the push plate. The push plate includes a central portion having an area smaller than an area of an upper side of the semiconductor chip, and a plurality of protrusions disposed at respective ends of the central portion.

According to an exemplary embodiment of the inventive concept, an apparatus for stacking semiconductor chips to be mounted on a substrate, each of the semiconductor chips including a joining member at a lower portion of the chip, the apparatus being configured to apply pressure to the semiconductor chips to connect the semiconductor chips to the substrate or to connect the semiconductor chips to each other, the apparatus including a stage on which the substrate is disposed. The semiconductor chips are stacked on the substrate. A push member that faces the stage is configured to apply pressure to each of the semiconductor chips. A pressure gauge is configured to measure the pressure applied to the semiconductor chips by the push member. The push member includes a push plate configure to contact at least one of the semiconductor chips and a push rod connected to the push plate. An area of a central portion of the push plate is smaller area than an area of an upper side of the at least one of the semiconductor chips. The central portion of the push plate at least partially overlaps the semiconductor chip. A plurality of protrusions is disposed at corners of the central portion of the push plate.

According to an exemplary embodiment of the inventive concept, an apparatus for stacking semiconductor chips includes a push member configured to apply pressure to a semiconductor chip. The semiconductor chip is disposed on a substrate. The push member includes a push plate configured to contact the semiconductor chip, and a push rod connected to the push plate. The push plate includes a flat first portion and two or more flat second portions disposed at ends of the flat first portion. The push plate is configured such that when the push member applies the pressure to the semiconductor chip, the flat first portion of the push plate fully overlaps the semiconductor chip, and each of the two or more flat second portions at least partially overlap the semiconductor chip.

BRIEF DESCRIPTION OF THE DRAWINGS

The above and other aspects and features of the inventive concept will become more apparent by describing in detail exemplary embodiments thereof in conjunction with the accompanying drawings, in which.

DETAILED DESCRIPTION OF THE EMBODIMENTS

Exemplary embodiments of the inventive concept will now be described more fully with reference to the accompanying drawings. When a layer or element is described as being disposed or stacked on another layer or element, the layer or element may be directly disposed or stacked on the other layer or element, or intervening layers or elements may be disposed or stacked therebetween.

Exemplary embodiments of the inventive concept relate to an apparatus for stacking semiconductor chips on a substrate or stacking an upper semiconductor chip on a lower semiconductor chip in a process of manufacturing a semiconductor package.

Figure 1:
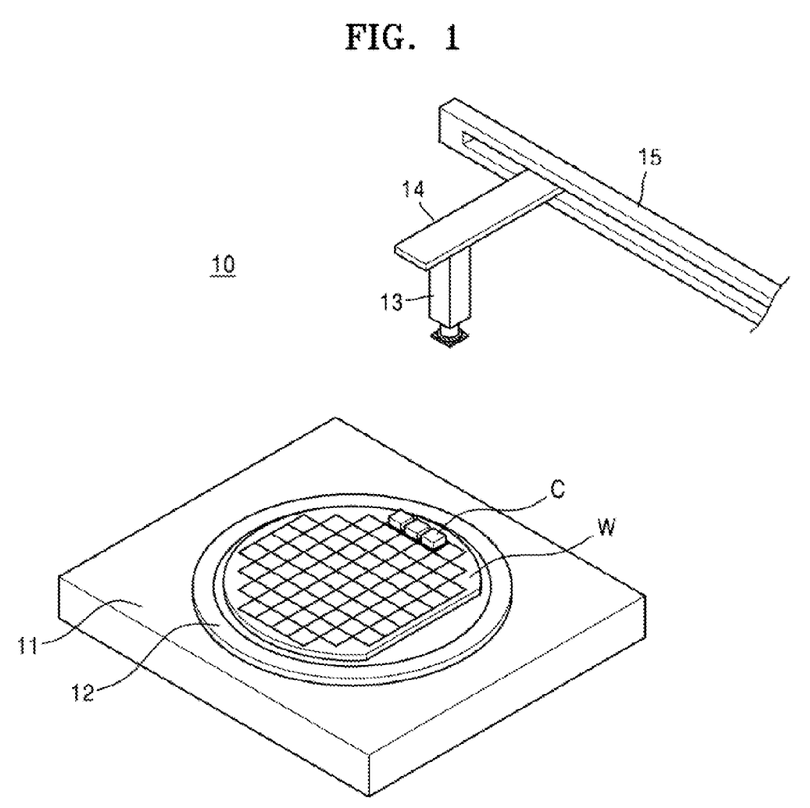
FIG. 1 is a perspective view illustrating a semiconductor chip feeding unit of an apparatus for stacking semiconductor chips, according to an exemplary embodiment of the inventive concept.

FIG. 1 is a perspective view illustrating a semiconductor chip feeding unit of an apparatus for stacking semiconductor chips, according to an exemplary embodiment of the inventive concept.

Referring to FIG. 1, the apparatus for stacking semiconductor chips may include a semiconductor chip feeding unit 10 configured to feed (e.g., pick up) semiconductor chips "C".

The semiconductor chip feeding unit 10 may include a table 11, a wafer feeder, a picker 13, a picker arm 14 and a picker arm feeder 15. A wafer "W" may be disposed on the table 11. The wafer "W" may include a plurality of semiconductor chips "C". The wafer feeder may be configured to load or unload the wafer "W" on or from a wafer fixing unit 12. The wafer fixing unit 12 may be disposed on the table 11. The picker 13 may be configured to pick up the semiconductor chips "C" of the wafer "W" by using vacuum pressure. The picker arm 14 is connected to the picker 13. The picker arm feeder 15 is connected to the picker arm 14. The picker arm 14 may be configured to move the picker 13 along a direction in which the picker arm 14 extends. The picker arm feeder 15 may be configured to move the picker arm 14 in a direction that may cross the direction in which the picker arm 14 extends.

A method of feeding the semiconductor chips "C" to the semiconductor chip feeding unit 10 will be described below.

The wafer "W", including the plurality of semiconductor chips "C", may be loaded on the wafer fixing unit 12 of the table 11 through the wafer feeding unit. The picker 13 may pick up a semiconductor chip "C" included in the wafer "W". The picked up semiconductor chip "C" may be stacked on a substrate "S" (see FIG. 2) or on another semiconductor chip "C" that has been previously completely fed (e.g., a semiconductor chip "C" that has been previously stacked on the substrate "S"). A process of stacking the semiconductor chips "C" may be repeatedly performed by repeating the above operations to stack the semiconductor chips "C" of the wafer "W" on one or more substrates "S" (see FIG. 2). The wafer "W" may be unloaded from the table 11 through the wafer feeding unit, and the feeding of the semiconductor chips "C" may be completed. The above operations may be performed in different sequences, as needed.

Figure 2:
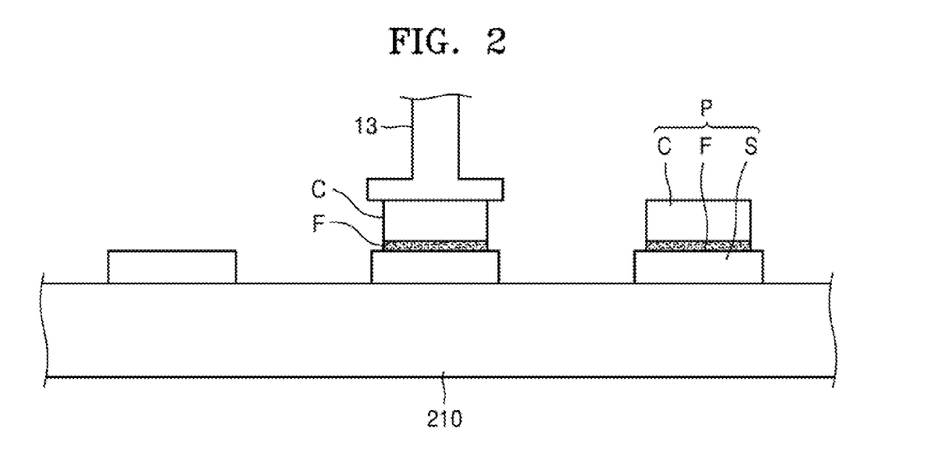
FIG. 2 is a side view illustrating a state in which a semiconductor chip feeding unit of an apparatus for stacking semiconductor chips is stacking a semiconductor chip, according to an exemplary embodiment of the inventive concept.

FIG. 2 is a side view illustrating a state in which the semiconductor chip feeding unit 10 of an apparatus for stacking semiconductor chips is stacking a semiconductor chip "C", according to an exemplary embodiment of the inventive concept.

A process of stacking a semiconductor chip "C" on a substrate "S" by using the semiconductor chip feeding unit 10 (see FIG. 1) is illustrated in FIG. 2. In addition, a method of manufacturing a semiconductor package "P" is illustrated in FIG. 2.

One or more substrates "S" may be prepared on a stage 210 of a bonding unit 100 (see FIG. 3) of the apparatus for stacking semiconductor chips. A plurality of semiconductor chips "C" included in the wafer "W" (see FIG. 1) may be picked up by the picker 13. The semiconductor chips "C" may be die-attached on the substrate "S" by using the picker 13. A joining member "F" may be formed on the lower surface of the semiconductor chips "C". In an exemplary embodiment of the inventive concept, the joining member "F" may be a nonconductive film. Alternately, the joining member "F" may be a nonconductive paste, an anisotropic conductive film, or an anisotropic conductive paste. A detailed description thereof will be described below.

Although it is illustrated in the drawings that one semiconductor chip "C" is stacked on one substrate "S", the inventive concept is not limited thereto. For example, one or more additional semiconductor chips "C" may be stacked on top of another previously-stacked semiconductor chip "C". In an exemplary embodiment of the inventive concept, all the semiconductor chips "C" may include memory chips. The semiconductor chips "C" may be semiconductor chips of different kinds. In an exemplary embodiment of the inventive concept, the semiconductor chips "C" may include memory chips and/or controller chips. One controller chip and one or more memory chips may be stacked and mounted on a substrate "S". A detailed description thereof will be described below.

A semiconductor package "P", in which one or more semiconductor chips "C" are stacked on a substrate "S", may be manufactured using the process described above. After the process of stacking the semiconductor chips "C" on the one or more substrates "S" is completed, a stack inspection unit may inspect the semiconductor chips "C" and the substrates "S" to determine whether the semiconductor chips "C" are normally arranged on their respective substrates "S". In an exemplary embodiment of the inventive concept, the process of inspecting the semiconductor packages "P", using the stack inspection unit, may be omitted.

The semiconductor package "P", including the one or more semiconductor chips "C" stacked on the substrate "S", may be bonded by a bonding unit 100 (see FIG. 3) using the process described above.

Figure 3:
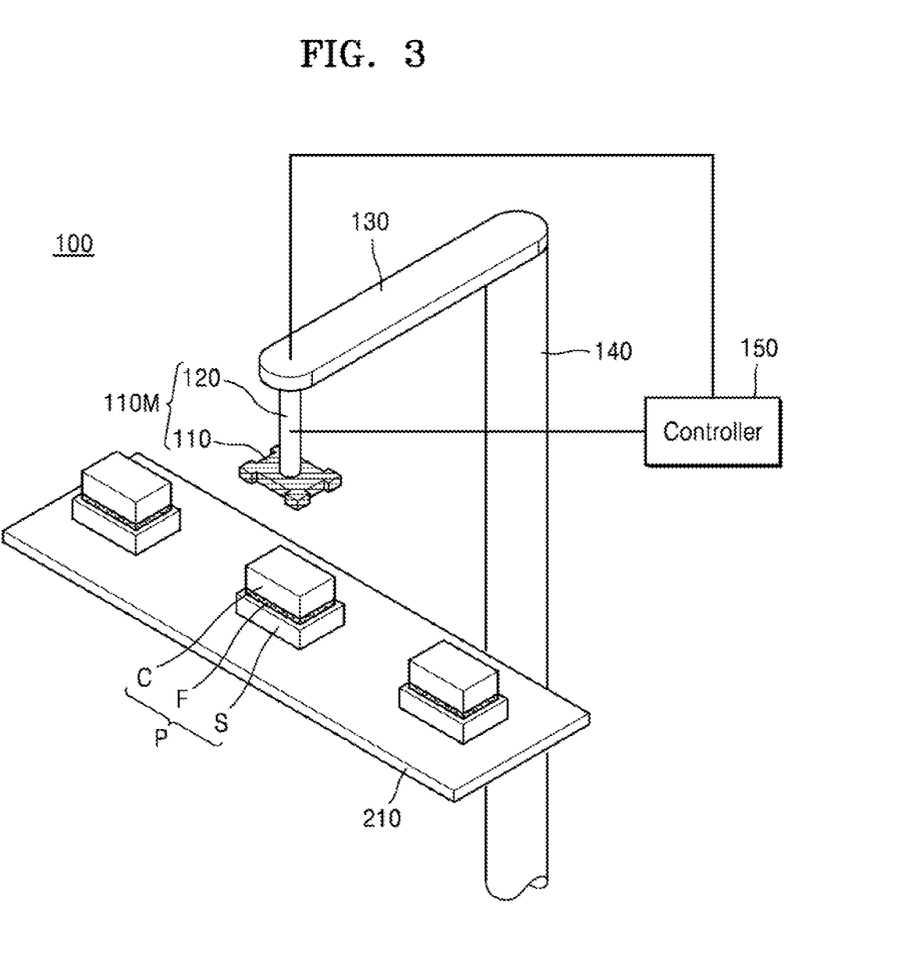
FIG. 3 is a perspective view illustrating a bonding unit of an apparatus for stacking semiconductor chips, according to an exemplary embodiment of the inventive concept.

FIG. 3 is a perspective view illustrating the bonding unit 100 of the apparatus for stacking semiconductor chips, according to an exemplary embodiment of the inventive concept.

Referring to FIG. 3, the bonding unit 100 may include a push member 110M including a push plate 110 and a push rod 120, a robot arm 130, a robot arm driver 140, and a stage 210.

The stage 210 may include a body part and a resilient part. The resilient part may be positioned on the upper surface of the body part. The resilient part may have a size corresponding to that of the body part. In an exemplary embodiment of the inventive concept, the resilient part may include a resilient material, for example, rubber. The rubber in the resilient part may include a heat resisting material. When steps (e.g., uneven surface elevations) are formed between the one or more semiconductor chips "C" stacked on the substrate "S", pressure applied to the semiconductor chips "C", located under the uppermost semiconductor chip "C", may be different than pressure applied to the uppermost semiconductor chip "C" due to the steps. The resilient part may distribute the pressure applied to the uppermost semiconductor chip "C" more evenly between the semiconductor chips "C" disposed under the uppermost semiconductor chip "C". Accordingly, even though steps may be formed between the stacked semiconductor chips "C", the pressure applied to the uppermost semiconductor chip "C" may be more evenly distributed to the one or more other semiconductor chips "C" disposed under the uppermost semiconductor chip "C", due to the resilient part.

The resilient part may be fixed to the body part by a fixing member. In an exemplary embodiment of the inventive concept, the fixing member may fix the resilient part to the body part by vacuum. A vacuum hole may be formed in the lower surface of the resilient part. A plurality of vacuum holes may be formed, for example, in the lower surface of the resilient part. Vacuum lines connected to the vacuum holes may be formed in the stage 210. The vacuum lines may be connected to a pressure reduction member. A vacuum pump may be used as the pressure reduction member.

Alternatively, the resilient part may be fixed and coupled to the body part by an adhesive or a mechanical clamp.

The push member 110M may apply pressure to the semiconductor chip "C". One or a plurality of push members 110M may be included in the bonding unit 100. The push member 110M may be connected to the robot arm 130. The push member 110M may include a push plate 110 and a push rod 120 connected to the push plate 110. The push plate 110 functions to directly apply pressure to the upper surface of the semiconductor chip "C" while contacting the upper surface of the semiconductor chip "C". The push rod 120 may be moved upwards and downwards to apply pressure to the semiconductor chip "C" through the push plate 110.

The pressure applied to the semiconductor chip "C" may depend upon the arrangement and shape of the push plate 110. Accordingly, the arrangement and shape of the push plate 110 may be factors considered in the process of manufacturing a semiconductor package "P".

The robot arm 130 and the robot arm driver 140 may be used to dispose the push member 110M over the semiconductor chips "C". The robot arm 130 may be rotated clockwise or counterclockwise, and the robot arm driver 140 may be moved upwards or downwards.

A method of bonding a semiconductor chip "C" on a substrate "S" by using the bonding unit 100 will be described below. A process of applying pressure to a semiconductor chip "C" using the push member 110M may include a presetting operation, an adjusting operation, a loading operation, and a pressing operation.

In the presetting operation, the push member 110M determines an initial value of pressure (pressure value) which will be applied to the semiconductor chip "C" by the push member 110M. At this time, no semiconductor package "P" is provided on the stage 210. The initial pressure value may be different according to the size and type of the semiconductor chips "C" and the number of stacked semiconductor chips "C".

In the adjusting operation, an adjusting or setting pressure value is determined based on the pressure to be applied to a semiconductor chip "C", by increasing or decreasing the initial pressure value, in consideration of the number and type of the semiconductor chips "C" stacked on the substrate "S".

In the loading operation, the semiconductor package "P" may be located on the stage 210.

The pressing operation may include a fixed pressing operation and a variable pressing operation. In the fixed pressing operation, the push member 110M presses the semiconductor chip(s) "C" with a pressure that is based on a ratio of the adjusting or setting pressure value. In the variable pressing operation, a controller 150 presses the semiconductor chip(s) "C" again, by adjusting (e.g., reducing, maintaining, or increasing) the adjusting or setting pressure value based on a pressure value measured by a pressure gauge 125 (see FIG. 4).

Figure 4:
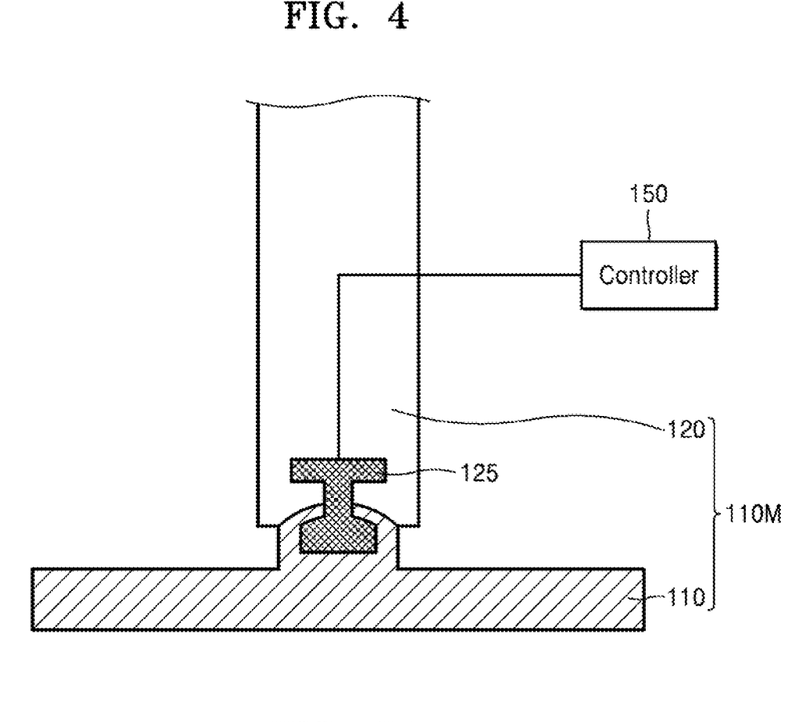
FIG. 4 is an enlarged cross-sectional view illustrating a push member of the bonding unit of the apparatus for stacking semiconductor chips of FIG. 3, according to an exemplary embodiment of the inventive concept.

FIG. 4 is an enlarged cross-sectional view illustrating the push member 110M of the bonding unit 100 of the apparatus for stacking semiconductor chips of FIG. 3, according to an exemplary embodiment of the inventive concept.

Referring to FIG. 4, the push member 110M may include a push plate 110 and a push rod 120 connected to the push plate 110. The push plate 110 may be used to directly apply pressure to the upper surface of a semiconductor chip "C" by contacting the upper surface of the semiconductor chip "C". The push rod 120 may be moved upwards and downwards to apply pressure to the semiconductor chip "C" through the push plate 110.

The push member 110M may include the pressure gauge 125. The pressure gauge 125 may measure the pressure of the push member 110M. The pressure gauge 125 may be located in a joint of the push member 110M, for example, where the push plate 110 and the push rod 120 are connected to each other, as illustrated in FIG. 4. The pressure gauge 125 may include a controller 150.

While the push member 110M applies a pressure to a semiconductor chip "C" (see FIG. 3) based on a pressure value measured by the pressure gauge 125, the controller 150 adjusts the pressure applied to the push plate 110 by the push rod 120 such that the pressure applied to the semiconductor chip "C" (see FIG. 3) by a central portion of the push plate 110 is substantially the same as the pressure applied to the semiconductor chip "C" (see FIG. 3) by a peripheral portion of the push plate 110.

A push rod 120 may be connected to the upper surface of a push plate 110. A lengthwise direction of the push rod 120 may coincide with the central axis of the push plate 110. For example, the push rod 120 may be connected to the push plate 110 at the center of the push plate 110. The push rod 120 may be coupled to the push plate 110 through the joint of the push member 110M. The push rod 120 may move the push plate 110 upwards and downwards, and the push plate 110 may apply pressure to the semiconductor chip(s) "C" (see FIG. 3). The push rod 120 may include a hydraulic motor and/or a cylinder.

The pressure gauge 125 measures a pressure applied by the push member 110M to the semiconductor chip(s) "C" (see FIG. 3). The measured pressure may be converted and transmitted to the controller 150 as an electrical signal. The pressure gauge 125 may include, for example, a load cell to measure the pressure applied to the semiconductor chip(s) "C". The controller 150 may control an output of the hydraulic motor of the push rod 120 based on the signal transmitted by the pressure gauge 125. When the apparatus for stacking semiconductor chips "C" includes a plurality of push members 110M, the controller 150 may independently control the outputs of the respective hydraulic motors of the push rods 120.

Figure 5A:
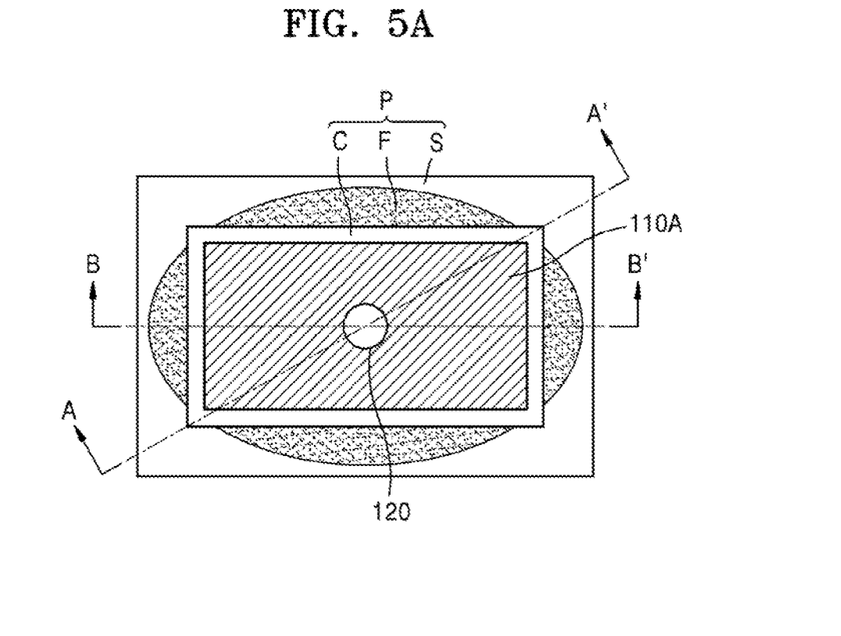
FIGS. 5A to 5C are plan and cross-sectional views illustrating a push member of an apparatus for stacking semiconductor chips according to an approach, and a semiconductor package formed by the apparatus for stacking semiconductor chips.
Figure 5B:
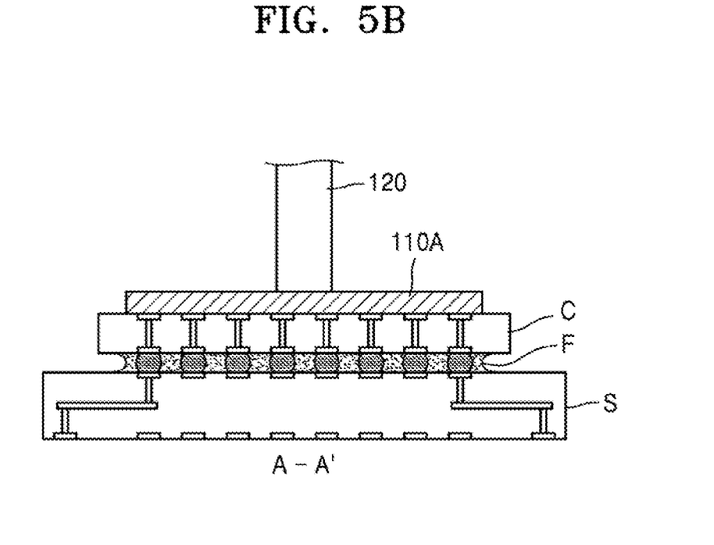
Figure 5C:
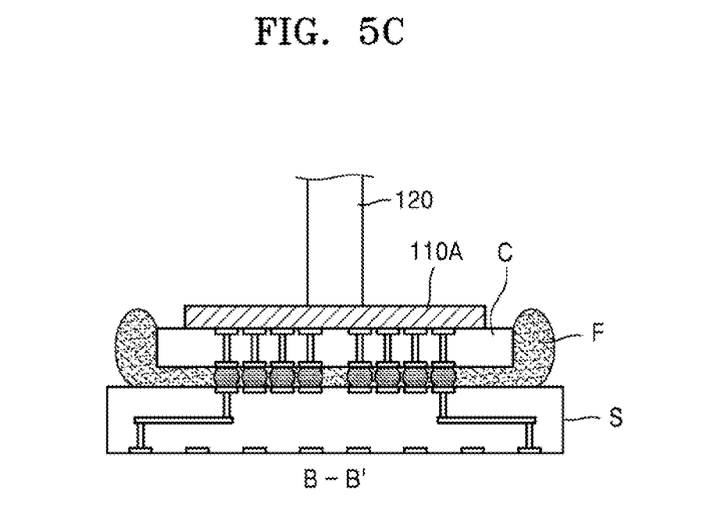

FIGS. 5A to 5C are plan and cross-sectional views illustrating a push member of an apparatus for stacking semiconductor chips "C" according to an approach, and a semiconductor package formed by the same.

FIG. 5A, illustrates a top view of a semiconductor package "P", according to an approach, when pressure is applied to a semiconductor chip "C" by using a push plate 110A.

The push plate 110A, according to the approach of FIGS. 5A-5C, may have an area smaller than the area of the upper side of the semiconductor chip "C". For example, in top view (e.g., plan view), the area of the push plate 110A may be smaller than, and may be entirely overlapped by, the upper area of the semiconductor chip "C".

In this case, when a pressure is applied to the semiconductor chip "C" through the push plate 110A, the joining member "F" may overflow from the edges of the semiconductor chip "C". Because the push plate 110A cannot directly apply pressure to a corner portion of the semiconductor chip "C", the joining member "F", which may be fluid, may be moved along the edges of the semiconductor chip "C" and may overflow therefrom.

The excessive overflow of the joining member "F" might not cause a problem to a semiconductor chip "C" having a through silicon via (TSV). However, the excessive overflow of the joining member "F" may cause a problem to a semiconductor chip "C" that does not have a TSV at the uppermost end of the semiconductor package "P", in which one or more semiconductor chips "C" are stacked.

When the joining member "F" overflows, the joining member "F" may reach the upper surface of the uppermost semiconductor chip "C". In this case, the joining member "F" may remain on the upper surface of the uppermost semiconductor chip "C". When sealing the semiconductor package "P" using a mold, the mold and the joining member "F" may come into contact with each other. As a result, a crack may form in the uppermost semiconductor chip "C".

In a semiconductor package "P" which includes a plurality of semiconductor chips "C" having the TSV and a semiconductor chip "C" which does not have the TSV, the semiconductor chips "C" having a TSV may each have a thickness of 60 µm or less. In addition, the uppermost semiconductor chip "C" might be the semiconductor chip "C" which does not include the TSV. The uppermost semiconductor chip "C" may have a thickness of 60 µm or less so that the entire height of the semiconductor package "P" may be low. When the uppermost semiconductor chip "C" is thin (e.g., 60 µm or less), the joining member "F" may flow to the upper surface of the uppermost semiconductor chip "C" and may remain on the upper surface of the uppermost semiconductor chip "C". Accordingly, a crack may be formed in the uppermost semiconductor chip during the molding process.

FIG. 5B illustrates a sectional view of the semiconductor package "P" and the push plate 100A, taken along line A-A' of FIG. 5A, according to an approach.

Referring to FIG. 5B, a large portion of the area of the lower surface of the semiconductor chip "C" is bonded to the upper surface of the substrate "S" by the joining member "F", but the corner portions of the semiconductor chip "C" might not be filled with the joining member "F". This is because a portion of the joining member "F" overflows along the edges of the semiconductor chip "C". Accordingly, a relatively empty space is formed between the semiconductor chip "C" and the substrate "S". When the joining member "F" does not fill the relatively empty space between the semiconductor chip "C" and the substrate "S", cracks and contamination may occur in the semiconductor chip "C" due to the exposure of the lower surface of the semiconductor chip "C" during the process of manufacturing the semiconductor package "P".

FIG. 5C illustrates a cross-sectional view of the semiconductor package "P" and the push plate 110A, taken along line B-B' of FIG. 5A, according to an approach.

The joining member "F", in the areas in which the edges of the semiconductor chip "C" are located, may overflow. Thus, the joining member "F" may reach an area of an upper portion of the semiconductor chip "C". When the joining member "F" overflows, an upper portion of the semiconductor chip "C" and the push plate 110A may be contaminated. This may negatively impact the manufacturing process of the semiconductor package "P".

To prevent contamination of an upper portion of the semiconductor chip "C" due to the excessive overflowing of the joining member "F", the upper portion of the semiconductor chip "C" may be covered by a foil head, and then pressure may be applied to the semiconductor chip "C" using the push plate 110A. In this case, contamination of the semiconductor chip "C" may be prevented, but a time taken to manufacture the semiconductor package "P" and manufacturing costs may increase due to the use of the foil head.

Figure 6A:
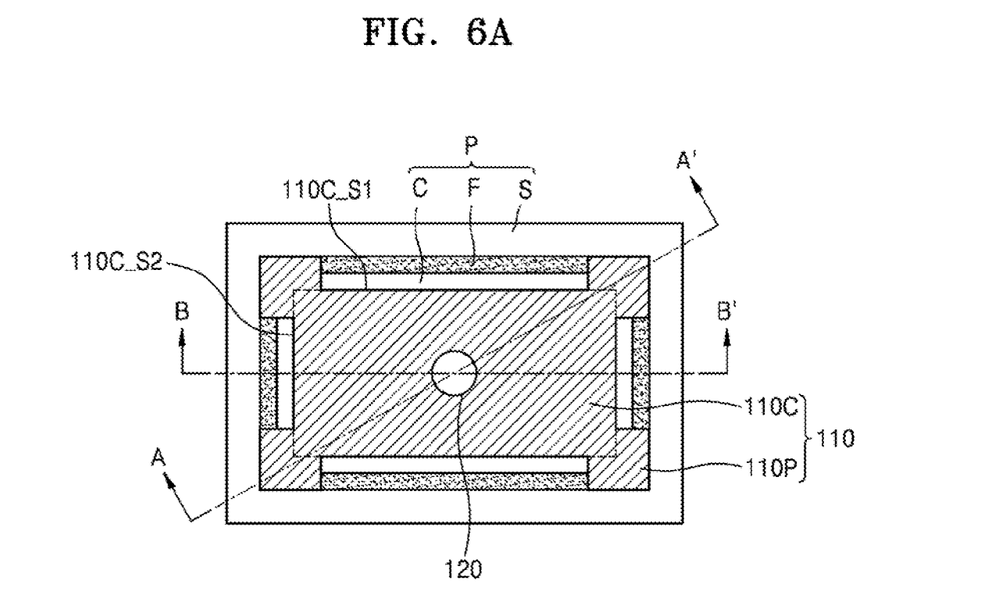
FIGS. 6A to 6C are plan and cross-sectional views illustrating a push member of an apparatus for stacking semiconductor chips, and a semiconductor package formed by the apparatus for stacking semiconductor chips, according to an exemplary embodiment of the inventive concept.
Figure 6B:
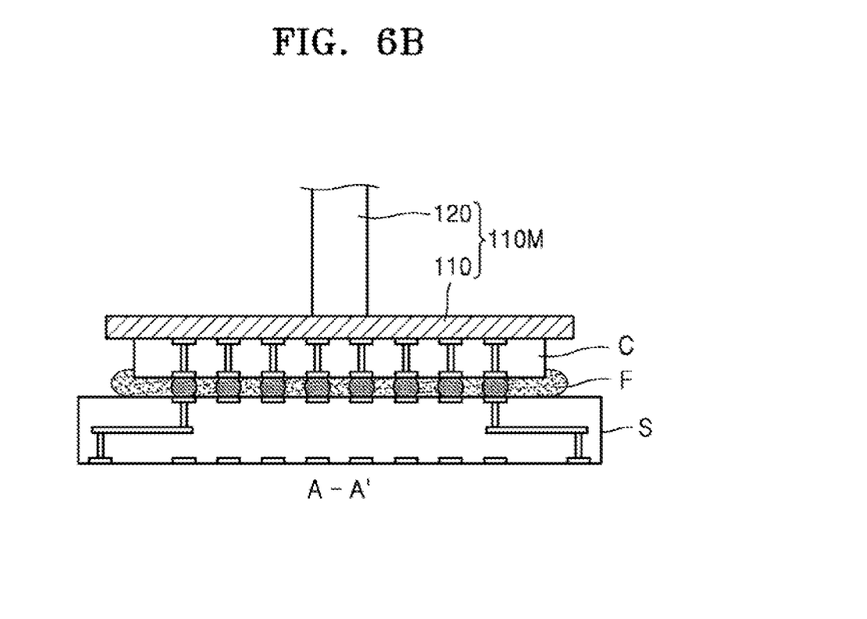
Figure 6C:
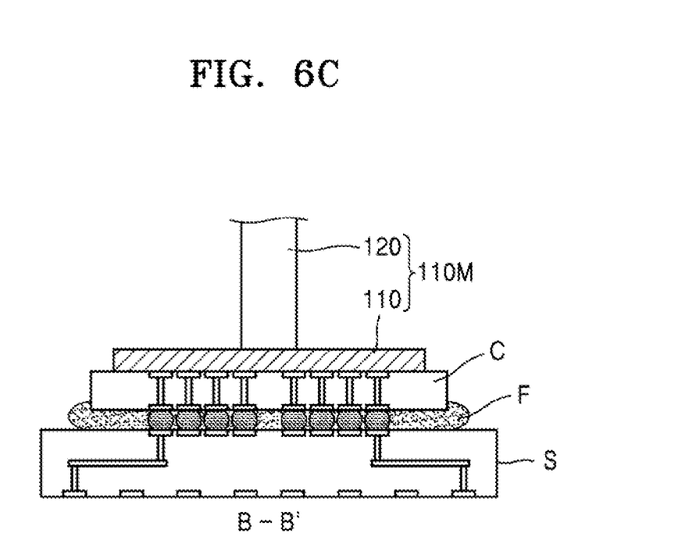

FIGS. 6A to 6C are plan and cross-sectional views illustrating a push member 110M of an apparatus for stacking semiconductor chips, and a semiconductor package formed by the apparatus for stacking semiconductor chips, respectively, according to an exemplary embodiment of the inventive concept. The same reference numerals used with reference to FIGS. 1 to 4 may be used in the description of FIGS. 6A to 6C.

Referring to FIG. 6A, when an area of the push plate 110, which corresponds to the semiconductor chip "C", is viewed from the top, the push plate 110 may include a central portion 110C having an area that is smaller than the area of an upper side of the semiconductor chip "C", and protrusions 110P at the corners of the central portion 110C, according to an exemplary embodiment of the inventive concept.

The push plate 110 may include a central portion 110C. The outer boundary of the central portion 110C may correspond to the virtual lines 110C_S1 and 110C_S2. The virtual lines 110C_S1 and 110C_S2 may run parallel to the edges of the semiconductor chip "C" and protrusions 110P. The protrusions 110P may be defined as the areas of the push plate 110 which exclude the central portion 110C.

As illustrated in FIGS. 6A to 6C, the push plate 110 has a cuboid (e.g., polygonal) central portion 110C, and each of the protrusions 110P may have compound cuboid shapes (e.g., two connected cuboid shapes, or a polygonal shape) and protrude from a corner of the central portion 110C. Each of the protrusions 110P may be positioned at two adjacent edges of the central portion 110C. However, the shapes of the central portion 110C and the protrusions 110P are not limited thereto.

In this case, the pressure applied to an upper portion of the semiconductor chip "C" by the push plate 110 may be transferred to the upper portion of the semiconductor chip "C" by the central portion 110C and the protrusions 110P. Accordingly, the central portion of the semiconductor chip "C" and the corner portions of the semiconductor chip "C" may be subjected to the same or substantially the same pressure by the push plate 110. For example, the entire upper portion of the semiconductor chip "C" may be subjected to substantially uniform pressure by the central portion 110C and the protrusions 110P.

When the entire upper portion of the semiconductor chip "C" is subjected to a substantially uniform pressure, a substantially uniform pressure may be applied to the joining member "F" on the lower surface of the semiconductor chip "C". Accordingly, the joining member "F" may overflow by the same amount at the edges and the corners of the semiconductor chip "C". This is so because the pressure applied to the joining member "F" is more evenly dispersed. Accordingly, the joining member "F" does not overflow at any given portion of the semiconductor chip "C".

The space between the substrate "S" and the semiconductor chip "C" closest to the substrate "S", and the spaces between the stacked semiconductor chips "C", may be filled with the joining member "F". Accordingly, the reliability of the semiconductor package "P" may be increased by filling the edges and corners of the semiconductor chip "C" with the joining member "F" during the manufacturing process. In addition, the same or substantially the same amount of joining member "F" may overflow at the edges and corners of the semiconductor chip "C" during the manufacturing process.

In an exemplary embodiment of the inventive concept, the push plate 110 may include a resilient material, for example, rubber. The central portion 110C of the push plate 110 may include a material having a first strength (e.g., rigidity) and the protrusions 110P may include a material having a second strength greater than the first strength. Accordingly, the push plate 110 may have a joining structure formed of dissimilar materials. For example, the material having the first strength may be soft rubber, and the material having the second strength may be hard rubber. Thus, the central portion 110C and the protrusions 110P may include materials with different moduli of elasticity from each other.

In this case, the pressure applied to the upper portion of the semiconductor chip "C" by the push plate 110 may be dispersed due to the resilient deformation of the push plate 110. Further, because the strength of the material included in the protrusions 110P of the push plate 110 may be large, the protrusions 110P of the push plate 110 might not be easily deformed. Accordingly, the same or substantially the same pressure may be applied to the central portion and the corner portions of the semiconductor chip "C". In this case, occurrence of a phenomenon in which the corner portions of the semiconductor chip "C" are not filled with the joining member "F" may be prevented.

As can be seen with reference to FIGS. 6A and 6B, in a top view (e.g., plan view), a diagonal length (e.g., from a corner of a protrusion 110P to a corner of another protrusion 110P along a diagonal line of the push plate 110P) of the push plate 110 may be longer than a diagonal length of the semiconductor chip "C". For example, in top view, a length from the center of the push rod 120 to the furthermost corner of a first protrusion 110P is greater than a length from the center of the semiconductor chip "C" to the corner of the semiconductor chip "C" corresponding to the first protrusion 110P. The center of the push plate 100 may correspond to the center of the push rod 120.

In an exemplary embodiment of the inventive concept, in a top view, the central portion 110C of the push plate 110 may fully overlap the upper portion of the semiconductor chip "C", and each of the protrusions 110P may partially overlap the upper portion of the semiconductor chip "C".

Further, the push plate 110 may be symmetrical with respect to the push rod 120 (see FIGS. 6A-6C). However, exemplary embodiments of the inventive concept are not limited thereto.

FIG. 6B illustrates a cross-sectional view of the semiconductor package "P" and the push plate 110, taken along line A-A' of FIG. 6A, according to an exemplary embodiment of the inventive concept.

The entire lower surface of the semiconductor chip "C" may be filled with the joining member "F" to be bonded to the upper surface of the substrate "S" by the joining member "F". In this case, the corner portions of the semiconductor chip "C" may be filled with the joining member "F". This is so because the protrusions 110P (see FIG. 6A) of the push plate 110 apply substantially the same pressure to the central portion of the semiconductor chip "C" and to the corner portions of the semiconductor chip "C". Thus, a portion of the joining member "F" may overflow from under the semiconductor chip "C", but the joining member "F" may overflow only to a lesser degree.

Hereinafter, the semiconductor chip "C", the joining member "F", and the substrate "S", included in a semiconductor package "P", will be described according to an exemplary embodiment of the inventive concept.

One or more semiconductor chips "C" may be stacked on the upper surface of the substrate "S". The semiconductor chips "C" may include solid state memory, logics, microprocessors, analog elements, digital signal processors, or systems-on-chip, which perform various functions. Further, the semiconductor chips "C" may have a structure in which two or more semiconductor chips "C" are stacked on each other. The two or more semiconductor chips "C" that are stacked on each other may be memory chips of the same type, or one of the two semiconductor chips "C" may be a memory chip and the other may be a controller chip.

The substrate "S" may be a printed circuit board (PCB). The PCB may be a single-sided PCB or a double-sided PCB. In addition, the PCB and may be a multilayered PCB including one or more internal wiring patterns in the interior of the substrate "S". Moreover, the PCB may be a rigid PCB or a flexible PCB.

The joining member "F" may include a nonconductive adhesive or a nonconductive tape. The joining member "F" may cover a chip connecting member of the semiconductor chip "C". In an exemplary embodiment of the inventive concept, when the joining member "F" includes a nonconductive adhesive, a liquid nonconductive adhesive may be applied on a wafer "W" through dispensing. Alternatively a nonconductive tape may be attached to the wafer "W". When the joining member "F" includes a nonconductive tape, the joining member "F" may be attached to a wafer "W", but it may be difficult to control the joining member "F" at the corner portions of the semiconductor chips "C" when the wafer "W" is separated in units of semiconductor chips "C". When the joining member "F" includes a nonconductive adhesive, the adhesive application process may be difficult because the nonconductive adhesive (e.g., the joining member "F") may need to be applied to each of the semiconductor chips "C" on the wafer "W". However, after applying the nonconductive adhesive (e.g., the joining member "F") on the wafer "W", the joining member "F" may be used to fill the corner portions of the semiconductor chips "C", as described above, when stacking the semiconductor chips "C" on the substrate "S" or on other semiconductor chips "C".

In the process of applying pressure to the upper portion of a semiconductor chip "C" using the push member 110M, the joining member "F" may flow toward the outer periphery of the semiconductor chip "C" to fill the corner portions and the side surfaces of the semiconductor chip "C". Accordingly, the process of applying a pressure to an upper portion of the semiconductor chip "C" also may be referred to as an overflow process. The overflow process may be performed once per each semiconductor chip "C" at a specific temperature, or may be performed in stages at several temperatures per each semiconductor chip "C". In an exemplary embodiment of the inventive concept, when the overflow process is performed in stages at several temperatures, the temperature at each stage may vary according to the glass transition temperature characteristics of the joining member "F". Further, the overflow process may be performed at a relatively low temperature, for example, at a temperature around 120° C. or less.

FIG. 6C illustrates a cross-sectional view, taken along line B-B' of FIG. 6A, of the semiconductor package "P" and the push plate 110, according to an exemplary embodiment of the inventive concept.

A portion of the joining member "F" may overflow in the areas where the edges of the lower surface of the semiconductor chip "C" are located. Because the joining member "F" overflows so that a portion of the side surfaces of the semiconductor chip "C" is surrounded by the joining member "F", the overflowing of the joining member "F" might not influence or flow to the upper portion of the semiconductor chip "C". Accordingly, when a pressure is applied to a semiconductor chip "C" by using the push plate 110, the overflowing of the joining member "F" might prevent the semiconductor chip "C" from cracking. Thus, the reliability of a semiconductor package "P" may be increased.

Figure 7A:
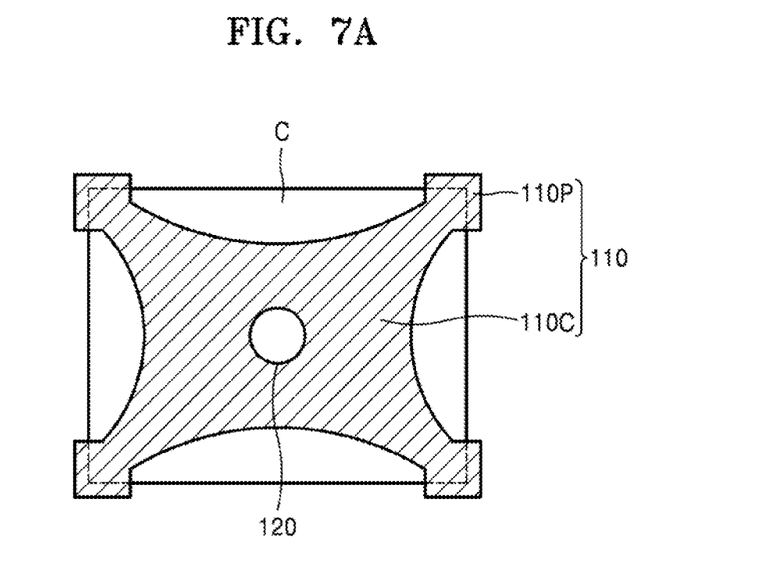
FIGS. 7A and 7B are cross-sectional and plan views illustrating a push member of an apparatus for stacking semiconductor chips according to an exemplary embodiment of the inventive concept.
Figure 7B:
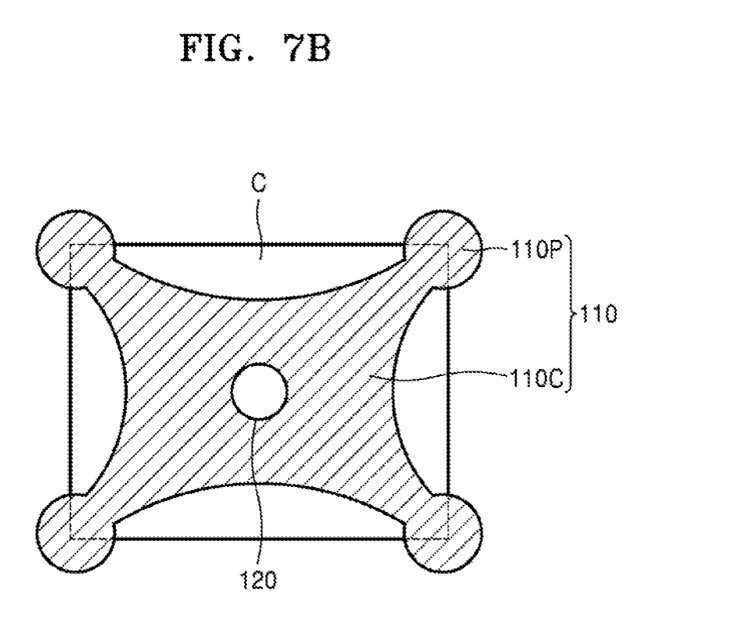

FIGS. 7A and 7B are cross-sectional and plan views illustrating a push member 110M of an apparatus for stacking semiconductor chips according to an exemplary embodiment of the inventive concept. The same reference numerals used with reference to FIGS. 1 to 4 and 6A to 6C may be used in the description of FIGS. 7A and 7B.

Referring to FIG. 7A, the central portion 110C of the push plate 110 may be concave in plan view. For example, the central portion 110C may have one or more concave portions, as shown in FIG. 7A. The push rod 120 (see FIG. 6C) may be attached to the center of the concaved central portion 110C.

Based on the overflow degree of the joining member "F" (see FIG. 6C) due to the pressure applied to the edges of the upper side of the semiconductor chip "C", the pressure applied to the upper portion of the semiconductor chip "C" may be adjusted through a change in the shape of the push plate 110. The shape of the push plate 110 may be designed to adjust a pressure applied to the upper surface of the semiconductor chip "C" according to the size and type of the semiconductor chips "C" and the number of stacked semiconductor chips "C" that are different from each other, depending on the type of the semiconductor package "P" being used.

The degree of concavity of the central portion 110C of the push plate 110 may be varied. For example, the central portion 110C may include shallow or deep concave parts (e.g., the degree of curvature of the parts of the central portion 110C that are connected to the protrusions 110P), as needed, to more evenly transfer the pressure applied by the push rod 120 to the upper surface of the semiconductor chip "C". In addition, the central concaved portion 110C and the protrusions 110P of the push plate 110 may include materials having different strengths.

Referring to FIG. 7B, the protrusions 110P of the push plate 110 may be circular. Accordingly, the shape of the protrusions 110P and the shape of the central portion 110C of the push plate 110 may vary. Based on the overflowing degree of the joining member "F" (see FIG. 6A) at the corner portions of the upper side of the semiconductor chip "C", the push plate 110 may be designed to have various shapes to prevent contamination of the push plate 110.

Although it is illustrated in FIGS. 7A and 7B that the central portion 110C of the push plate 110 has a concave shape and each of the protrusions 110P of the push plate 110 has a partially circular shape, the inventive concept is not limited thereto. For example, the protrusions 110P may have polygonal or other shapes. Further, the protrusions 110P may be formed to be symmetrical. However, the inventive concept is not limited thereto. In addition, the protrusions 110P of a push plate 110 may be designed to have different shapes from each other.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. An apparatus for stacking semiconductor chips, comprising: a push member configured to apply pressure to a semiconductor chip disposed on a substrate, and wherein the push member comprises a push plate configured to contact the semiconductor chip, and a push rod connected to the push plate, wherein the push plate comprises:
   a central portion having an area smaller than an area of an upper side of the semiconductor chip; and
   a plurality of protrusions disposed at corners of the central portion, and each of the plurality of protrusions protrudes over two adjacent edges of the central portion of the push plate,
   wherein a modulus of elasticity of the plurality of protrusions is higher than a modulus of elasticity of the central portion.

2. The apparatus of claim 1, wherein the central portion of the push plate has a polygon shape, at least two of the plurality of protrusions have a same shape as each other.

3. The apparatus of claim 1, wherein the central portion of the push plate includes one or more concave portions.

4. The apparatus of claim 1, wherein the push plate includes a resilient material.

5. The apparatus of claim 1, wherein a first length from a center of the push plate to a furthermost corner of a first protrusion of the plurality of protrusions is greater than a second length from a center of the upper side of the semiconductor chip to a corner of the semiconductor chip.

6. The apparatus of claim 1, wherein when overlapping the push plate with the semiconductor chip, an area formed by edges of the central portion of the push plate fully overlaps an upper portion of the semiconductor chip, and at least one of the plurality of protrusions partially overlaps the upper portion of the semiconductor chip.

7. The apparatus of claim 1, wherein the push plate has a symmetrical structure with respect to the push rod.

8. The apparatus of claim 1, wherein each of the plurality of protrusions of the push plate has a circular shape.

9. The apparatus of claim 1, wherein the push plate is configured to apply a same pressure to a central portion of the upper side of the semiconductor chip and to corner portions of the upper side of the semiconductor chip.

10. The apparatus of claim 1, wherein the protrusions are upwardly protruded from a surface of the push plate, and wherein the protrusions and the push rod are attached on the same surface of the push plate.

11. The apparatus for stacking semiconductor chips of claim 1, wherein an area of direct contact between the push plate and an upper surface of the semiconductor chip is smaller than the area of the upper surface of the semiconductor chip.

12. An apparatus for stacking semiconductor chips to be mounted on a substrate, each of the semiconductor chips comprising a joining member at a lower portion of the chip, the apparatus being configured to apply pressure to the semiconductor chips to connect the semiconductor chips to the substrate or to connect the semiconductor chips to each other, the apparatus comprising:
   a stage on which the substrate is disposed, wherein the semiconductor chips are stacked on the substrate;
   a push member that faces the stage and is configured to apply pressure to each of the semiconductor chips; and
   a pressure gauge configured to measure the pressure applied to the semiconductor chips by the push member,
   wherein the push member comprises a push plate configured to contact at least one of the semiconductor chips and a push rod connected to the push plate, and
   wherein an area of a central portion of the push plate is smaller than an area of an upper side of the at least one of the semiconductor chips, wherein the central portion of the push plate at least partially overlaps the semiconductor chip, and wherein a plurality of protrusions is disposed at corners of the central portion of the push plate, and herein a modulus of elasticity of the plurality of protrusions is higher than a modulus of elasticity of the central portion.

13. The apparatus of claim 12, further comprising a controller configured to adjust the pressure applied to the at least one of the semiconductor chips by the push member.

14. The apparatus of claim 13, wherein the pressure applied to the push plate is adjusted by the controller while the push member applies a pressure to the at least one of the semiconductor chips such that a central portion of the upper side of the at least one of the semiconductor chips and corners of the upper side of the at least one of the semiconductor chips are subjected to substantially the same pressure by the push plate.

15. The apparatus of claim 12, wherein an area of the push plate which contacts the upper side of the at least one of the semiconductor chips is a flat surface.

16. An apparatus for stacking semiconductor chips, comprising: a push member configured to apply pressure to a semiconductor chip, wherein the semiconductor chip is disposed on a substrate, and wherein the push member comprises a push plate configured to contact the semiconductor chip, and a push rod connected to the push plate, wherein, the push plate comprises:
 a flat first portion; and
 two or more flat second portions disposed at ends of the flat first portion, wherein the flat first portion includes a curved part and one of the two or more flat second portions is disposed at a first end of the curved part, wherein the push plate is configured such that when the push member applies the pressure to the semiconductor chip, the flat first portion of the push plate is fully overlapped by the semiconductor chip, and each of the two or more flat second portions at least partially overlap the semiconductor chip, wherein a modulus of elasticity of the flat first portion is lower than a modulus of elasticity of the two or more flat second portions.

17. The apparatus of claim 16, wherein the one of the two or more flat second portions hangs over the semiconductor chip.

18. The apparatus of claim 16, wherein, in plan view, the flat first portion is smaller than the semiconductor chip.

19. The apparatus of claim 16, wherein the push rod is disposed at a center of the flat first portion.

* * * * *